United States Patent [19]

Rodrigues et al.

[11] Patent Number: 4,654,850

[45] Date of Patent: Mar. 31, 1987

[54] TRI-STATE IN-CIRCUIT LOGIC COMPARATOR WITH AUTOMATIC INPUT/OUTPUT TERMINAL DISCRIMINATION

[76] Inventors: John M. Rodrigues, 870 Muender Ave., Sunnyvale, Calif. 94086; Michael G. Wicksted, 4960 Avenida de Carmen, Santa Clara, Calif. 95054

[21] Appl. No.: 688,206

[22] Filed: Jan. 2, 1985

[51] Int. Cl.$^4$ ............................................. G06F 11/00
[52] U.S. Cl. ..................................... 371/25; 324/73 R
[58] Field of Search ....................... 371/25, 29, 60, 67; 324/73 R, 73 AT

[56] References Cited

U.S. PATENT DOCUMENTS

| | | | |
|---|---|---|---|
| 3,614,608 | 10/1971 | Gledd | 371/25 |
| 3,633,016 | 1/1972 | Walker | 371/25 |
| 3,821,645 | 6/1974 | Vinsani | 371/25 |
| 3,924,109 | 12/1975 | Jhu | 371/25 |
| 4,556,976 | 12/1985 | Howarth | 371/25 |

Primary Examiner—Michael R. Fleming
Attorney, Agent, or Firm—Allston L. Jones

[57] ABSTRACT

A logic comparator circuit and system for testing the operation of an operating logic circuit installed a powered system against the operation of a known good, or reference, logic circuit of the same type or style. This is accomplished by applying the power, return and input signals of the operating logic circuit to the reference logic circuit and then comparing the corresponding output signals of each to detect improper operation. The present invention makes the interconnection of the two logic circuits to the logic comparator simple by only requiring that the user designate which terminals of the logic circuits are for power and return. The present logic circuit is provided with means for automatically discriminating between input and output terminals of the two logic circuits, and for clamping a free floating terminal of the operating logic circuit so that it may be detected repeatably.

22 Claims, 3 Drawing Figures 4,654,850

TRI-STATE IN-CIRCUIT LOGIC COMPARATOR WITH AUTOMATIC INPUT/OUTPUT TERMINAL DISCRIMINATION

BACKGROUND OF THE INVENTION

The present invention relates to logic comparators, and more particularly to tri-state logic comparators.

Prior art logic comparators compare the operation of a unit under test (UUT) with a known good, or reference, logic circuit or IC of the same configuration or part style as the UUT. To effect the comparison the same input stimulus is applied simultaneously to both the UUT and the reference logic circuit. These logic comparators typically include means for connecting to each of the external terminals of the UUT, comparator means for comparing the signals on the corresponding terminals of the UUT with those of the reference circuit, and interface means for presetting the comparator means for each terminal as a power, ground, input or output terminal. The interface means includes switches, specially designed program cards, (e.g., Hewlett-Packard Model 10529A), or programmable sockets (Fluke Model Trendar 200) to interconnect the corresponding power, ground and input terminals of the reference and UUT, and connects each of the corresponding output terminals to a separate exclusive OR gate where the signal from the UUT is compared with the signal from the reference circuit.

These types of comparators are primitive and cumbersome since they can only be used to test simple gates and counters. They do not provide repeatable results when testing a tri-state or open circuit output terminal of the UUT.

Additionally, these devices do not lend themselves to the testing of bi-directional devices where a single terminal of the device toggles between an input and an output function at such a rate so as to make it impossible to manually change the interface means as necessary during testing.

What is needed is a logic comparator which is capable of automatically discriminating between an input and an output terminal without the need for switches or program cards even when the change occurs during operation as with a bi-directional device, and one that can repeatably test a tri-state or open circuit output terminal, wherein it is only necessary to predesignate the power and ground terminals of the UUT and reference devices. The present invention provides such a device.

SUMMARY OF THE INVENTION

In accordance with the illustrated embodiment, the present invention provides a logic comparator circuit and system for detecting operational errors of a selected logic circuit by comparing its operation against that of a known good or reference logic circuit of the same type and style with both circuits sharing common power, return and input signals. The logic comparator circuit includes one each of the circuit elements as in the logic comparator system with the system including an identical set of elements for each of the terminals of one of the two logic circuits. Included in the logic comparator is a logic detection means for monitoring the signals on the corresponding terminals of the two logic circuits to detect different logic signal levels between them while automatically discriminating between input and output terminals to accept input logic signals for application to the terminal of the reference logic circuit and to compare the output logic signals to generate an error signal if they are inconsistent.

Additionally, the present invention may also include a memory, or latch, for holding an error signal once generated by the logic detection means. The latch also serves as a driver for an error display means to provide a visible indication of the detected error. To reset the latch and to extinguish the displays, a reset means is included.

DESCRIPTION OF THE PREFERRED EMBODIMENT

Figure 1:
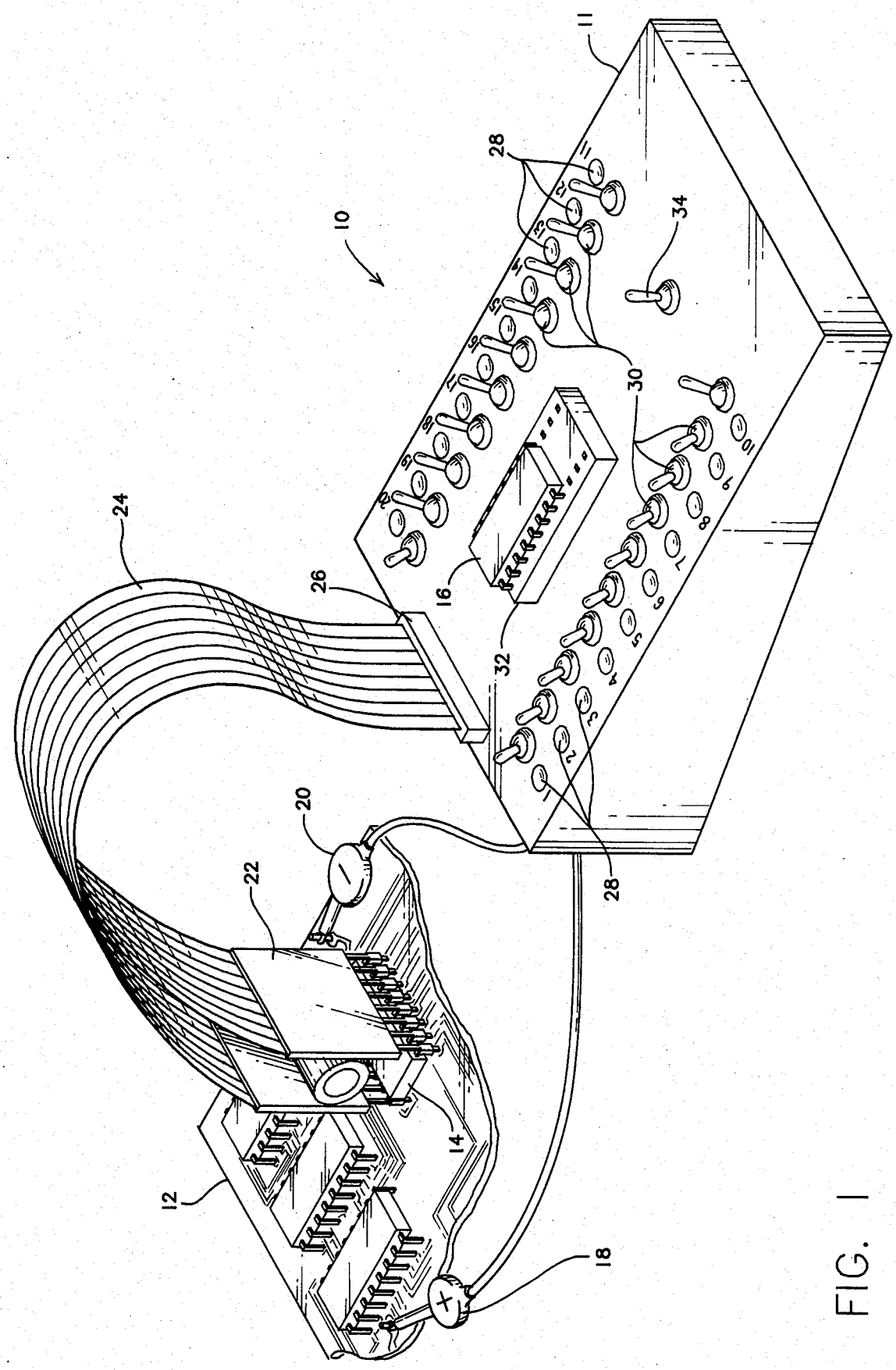
FIG. 1 is a perspective view of a completely assembled embodiment of the present invention shown interconnected with a unit under test (UUT) in an assembled printed circuit board shown partially cut-away.

Referring to FIG. 1 there is shown a logic comparator 10 of the present invention which includes enclosure 11 which contains the circuitry which will be discussed below with respect to FIGS. 2 and 3, reference IC 16 interconnected with the internal circuitry via socket 32, interconnect cable 24 together with connectors 26 and 22 for connecting to the unit under test 14 (UUT) in a powered printed circuit board 12, and power leads and connectors 18 and 20 for connecting logic comparator 10 to the power bus ($V_{cc}$) and return of powered printed circuit board 12.

The embodiment shown in FIG. 1 is for testing an IC in a DIP pack. By selecting a socket 32 which can accommodate the largest package (e.g., one having 20 pins) that it is anticipated that one may wish to test, any IC with up to that many pins can be tested with the same socket 32 as a result of the standard pin spacing of DIP packages. Cable 24 and connectors 22 and 26 will then also have the same number of conductors or pins as socket 32. A reference IC 16 of the same type and style (e.g., TTL 4 NAND gate package) as the UUT 14 is inserted into socket 32 and clip 22 is placed on UUT 14. It should be noted here that clip 22 must be placed on the UUT so that pin M of clip 22, which is connected to pin M of socket 32 into which lead L of reference IC 16 is inserted, is connected to lead L of UUT 14 so that signals on the corresponding pins of UUT 14 and reference IC 16 are being compared. To provide power to the comparator 10 circuitry, positive and negative power leads and connectors 18 and 20 are provided for connecting to bus and return pins, respectively, on printed circuit board 12. In this design, the power and return connections to the reference IC 16 are provided via connectors 22 and 26, cable 24 and socket 32 to permit the use of one design for various size and configurations of reference ICs without the necessity of including a complex switching arrangement by which power and return are applied to the appropriate pins of the reference IC. This approach also eliminates the possibility of accidentally applying power or return to pins of the reference IC and the UUT which may cause damage to those parts or other parts on the printed circuit board.

Before power is applied to logic comparator 10 or clip 22 attached to UUT 14, switches 30 must be placed in the proper position for the type and style of IC to be tested. For the pins of the IC which are neither the power or return pins the corresponding switches are opened, and for the power and return pins the corresponding switches are closed. For those pins of socket 32 which are unoccupied, the position of the corresponding switch 30 doesn't matter. However, to minimize the possibility of confusion or error, it is suggested that all of switches 30 first be placed in the open position and then only those corresponding to the power and return pins of the reference IC be closed.

Figure 2:
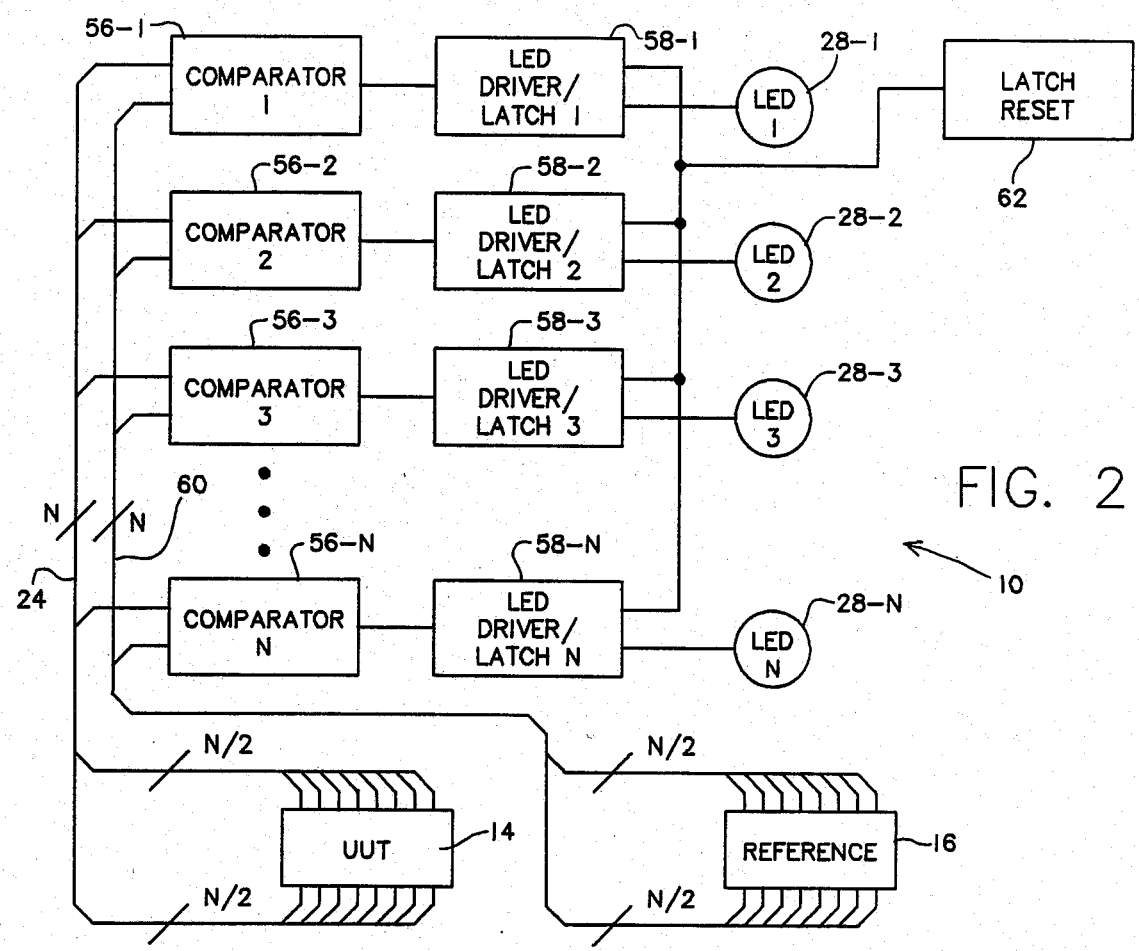
FIG. 2 is a block diagram of the circuitry of the system of the present invention.

The basic arrangement of the circuitry internal to enclosure 11 (FIG. 1) is illustrated in block diagram form in FIG. 2. Assuming that the reference IC connector socket 32 can accept an IC having up to N leads, the circuitry of logic comparator 10 will contain N identical test circuits. Each test circuit includes a serially connected combination including a comparator 56-x, an LED driver/latch 58-x, and an LED 28-x. Each of comparators 56-x includes two input terminals, one being connected via external cable 24 to pin x of the UUT interconnection connector 22 and the other being connected via internal cable 60 to pin x of the reference IC socket 32. Additionally, there is provided a latch reset circuit 62 which is shared by each of the LED driver/latch circuits 58-x.

In operation, when a mismatch between the input signals to any of comparators 56-x occurs, that comparator generates an output signal which triggers the corresponding LED driver/latch 58-x which in-turn causes its corresponding LED 28-x to be illuminated to indicate the error, and to remain illuminated until the latch reset 62 is manually activated by the user. When latch reset 62 is activated, all LED driver/latches 58 are reset and all LEDs 28 are placed in the off state.

Figure 3:
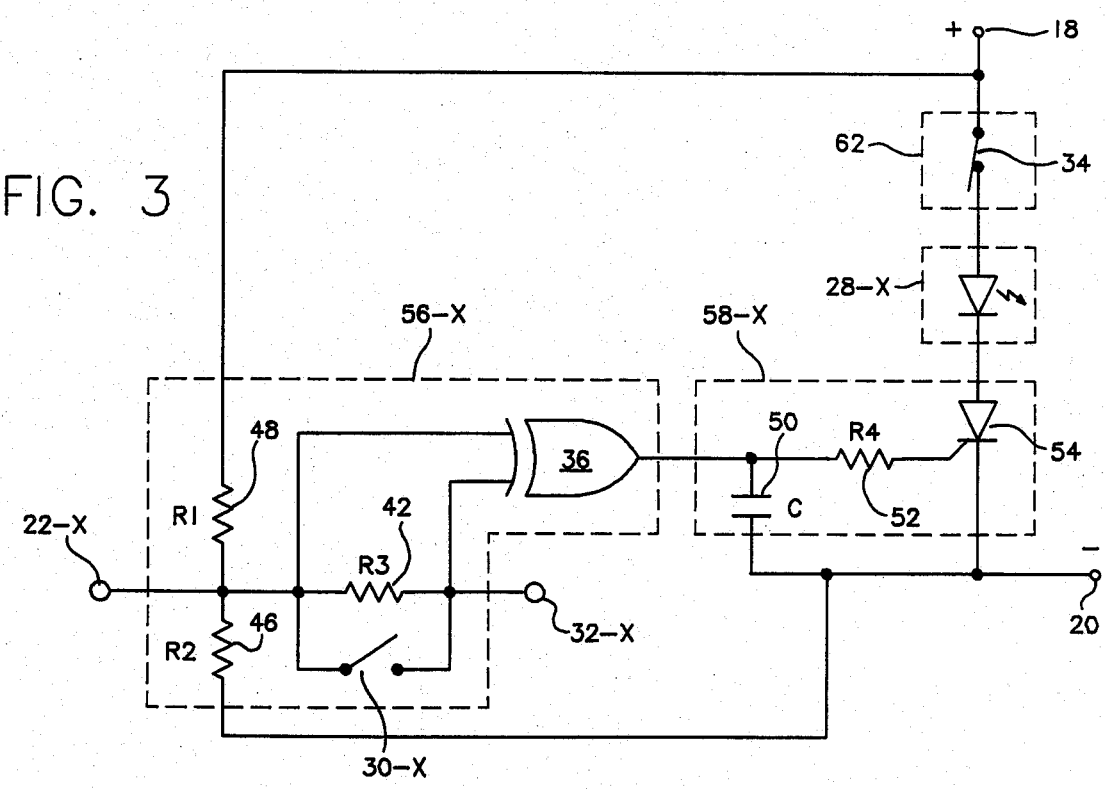
FIG. 3 is a schematic representation of one of a plurality of comparator circuits of the present invention as shown in FIG. 2.

Referring now to FIG. 3 there is shown a schematic representation of a preferred embodiment of a single comparator/driver/LED of FIG. 2. This circuit includes comparator 56-x, LED driver/latch 58-x, and LED 28-x. Comparator 56-x includes a pair of input terminals, terminal 22-x, for coupling to one pin of UUT 14 via cable 24, and terminal 32-x for coupling to a corresponding pin of reference circuit 16 via cable 60. Terminals 22-x and 32-x are each connected to a different input terminal of an exclusive OR gate 36 with a resistor 42 and switch 30-x connected in parallel therebetween. To insure proper operation of comparator 56-x, exclusive OR gate 36 should be selected to be of the same logic family as UUT 14 and reference circuit 16. Comparator 56-x further includes a voltage divider/line terminator connected to terminal 22-x. This divider/terminator is made up of a pair of resistors 46 and 48 with resistor 46 coupled between terminal 22-x and connector 20 (return), and resistor 48 is coupled between terminal 22-x and connector 18 ($V_{cc}$).

As discussed above, each of switches 30-x are normally open. Switch 30-x is only closed when terminal 22-x is coupled to a power or return pin of UUT 14. By closing switch 30-x under those conditions, power (or return) is applied directly to the corresponding pin of reference circuit 16 to properly power its operation without the voltage drop which would otherwise occur across resistor 42. By closing switch 30-x the potential on each of the input leads of exclusive OR gate 36 are identical, thus no error will be detected.

For the condition where the corresponding pins of UUT 14 and reference circuit 16 are input terminals, the input signal on the UUT 14 terminal will be coupled via resistor 42 to the reference circuit 16 terminal with no degradation of performance since the input impedance of the logic families (e.g., TTL, CMOS, etc.) for which this design may be utilized, is high, i.e., very little current will flow through resistor 42 resulting in only a small voltage drop across resistor 42 which will not reduce the logic voltage level below the logic 1 threshold level of reference circuit 16, therefore, there will be no discrepancy between the logic levels applied to the corresponding terminals of UUT 14 and reference circuit 16.

Next we will examine the condition where the corresponding terminals of UUT 14 and reference circuit 16 are output terminals. In this condition, there is a much greater probability that a sizeable current will flow through resistor 42. If the potential on the corresponding output terminals of UUT 14 and reference circuit 16 are the same, no appreciable current will flow through resistor 42 and exclusive OR gate 36 will not detect an error. When the potential on the corresponding output terminals of UUT 14 and reference circuit 16 are different, e.g., different logic states, a substantial current will flow through resistor 42 with a corresponding voltage drop which insures that exclusive OR gate 36 will detect an error. Thus, by the inclusion of resistor 42 across the input terminals of exclusive OR gate 36 it is not necessary to preprogram the logic comparator by means of switches or program cards to pre-sort the input terminals from the output terminals of UUT 14. Resistor 42 performs that function automatically.

Comparator 10 also allows for the testing of in-circuit bus-oriented ICs as UUT 14. Since tristate bus-oriented ICs have output terminals that float along with any other activity on the bus (when they are in the tristate mode), there will be no voltage drop across resistor 42 even when other ICs are active on the bus. There can only be a voltage drop across resistor 42 when UUT 14, and thus reference circuit 16, is enabled and "on line". In this manner the logic comparator 10 can only show errors when there is valid activity coming from the IC under test since reference circuit 16 is powered directly from UUT 14. The same principle allows for the testing of bi-directional ICs where a terminal of UUT 14 instantly changes from having an input function to an output function. Logic comparator 10 will only show an error indication when these pins are acting as an output terminal and outputting erroneous data.

The voltage divider/line terminator made up of resistors 46 and 48 have no effect on the testing of the above described circuit configurations and are provided to detect when a terminal on UUT 14 is not connected or is floating free of the circuitry internal to UUT 14. With resistors 46 and 48 such a free-floating terminal is gently clamped to prevent the voltage condition of the corresponding terminal on reference circuit 16 from being reflected to that terminal via resistor 42. Thus, the floating terminal will have its own level which will be detected by exclusive OR gate 36 since there will be a voltage drop across resistor 42. Resistors 46 and 48 also reduce signal crosstalk and echoes at high frequencies.

It must be noted here that if both the UUT 14 and reference circuit 16 each have fewer than N pins, then a plurality of comparators 56-x will have both input terminals 22-x and 32-x floating. With both input terminals floating, no error will be detected since they will both float to the same potential since there is no current flowing through resistor 42.

Referring now to LED driver/latch 58-x, which is coupled to receive the output signal from exclusive OR gate 36 of comparator 56-x, there is included a filter capacitor 50, a current limiting resistor 52 and an SCR 54. Also shown are LED 28-x and a switch 34 which provides the latch reset 62 of FIG. 2. Switch 34 is normally closed and is serially connected between the positive bus and the anode of LED 28-x. In turn, the cathode of LED 28-x is connected to the anode of SCR 54 and the cathode of SCR 54 is connected to the negative return line. The gate of SCR 54 is coupled to receive the output signal from exclusive OR gate 36 via serially connected resistor 52.

In operation, when comparator 56-x detects an error its output signal is coupled to the gate of SCR 54 which then fires, latching to hold the error indication when it begins to conduct causing current to flow through LED 28-x illuminating it. Switch 34 is provided for the user to manually reset the circuit. This is done by opening switch 34 to interrupt the flow of current through SCR 54, which returns it to a non-conductive state in which it remains until the next trigger signal is applied to its gate, even when switch 34 is again returned to its normally closed position.

The inclusion of filter capacitor 50 is optional at low frequencies and of increasing importance as the operation frequency of UUT 14 increases. Capacitor 50 shunts to return the high frequency noise which is present in the output signal from comparator 56-x. In addition, the valve of capacitor 50 can be varied to adjust the pulse width sensitivity of the triggering of SCR 54. This will also adjust for some timing shifts due to cable noise, etc., which may produce a false error indication, particularly at high operating frequencies.

As alluded to above, this implementation of a logic comparator is applicable to logic circuits having high impedance input terminals and which define the logic levels by the output logic levels (e.g., 0 and 5 volts). These include, for example, TTL, DTL, RTL, CMOS, and some discrete circuits.

During final design analysis it was discovered that the frequency range over which this design functions is largely dependent on the type of resistor selected for resistor 42 of comparator 56-x. If a carbon film resistor is used here the speed tops out at about 4-5 MHz, if a wire wound resistor is used, the top end is somewhat lower than with the carbon film as a result of its inductive characteristic at high frequencies, and if a metal film resistor is used it will have a top speed of about 10 MHz. Typical values of resistors 42 ($R_3$), 46 ($R_2$), 48 ($R_1$) and 52 ($R_4$), and capacitor 50 (C) for testing TTL or CMOS logic families are given in the table below.

TABLE I

| Typical Component Values | | |
|---|---|---|
| | TTL | CMOS |
| $R_1$ | 1KΩ | 2.7KΩ |
| $R_2$ | 5.1KΩ | 100KΩ |
| $R_3$ | 365Ω | 2.7KΩ |
| $R_4$ | 1KΩ | 1KΩ |
| C | .01 μfd | .0027 μfd |

From the foregoing description, it will be apparent that the invention disclosed herein provides a novel and advantageous in-circuit logic comparator. As will be understood by those familiar with the art, the invention may be embodied in other specific forms without departing from the spirit or essential characteristics thereof.

What is claimed is:

1. A logic comparator system for comparing the operation of a selected logic circuit in a powered circuit against the operation of a like type and style reference logic circuit with each circuit having N terminals including at least one each of an input, an output, a power and a return terminal where N is a positive integer of 4 or greater, said powered circuit providing power bus and return signals to the appropriate terminals of the selected logic circuit, said logic comparator comprising:

M error detection means, where M is a positive integer which is equal to or greater than N, for monitoring the signals on corresponding terminals of the selected logic circuit and the reference logic circuit to detect different logic signal levels thereon and to generate an error signal if they are inconsistent;

M discrimination means connected between each of the corresponding terminals of the selected logic circuit and the reference logic circuit for automatically discriminating during operation between input and output type terminals to prevent the generation of a false error signal, and for applying the input signals on the terminals of the selected logic circuit to the corresponding terminals of the reference logic circuit; and interconnection means for connecting the corresponding terminals of the selected logic circuit and the reference logic circuit to the M error detection means with each corresponding terminal pair connected to a different one of the M error detection means.

2. A logic comparator system as in claim 1 further comprising:

M error display means, one each responsive to the error signal from each of said M error detection means, for visibly displaying an error indication;

M error display driver and memory means, one each coupled to receive the output error signal from each of said M error detection means, for latching upon the occurrence of said error signal to continuously drive the corresponding error display means; and reset means for resetting each of said memory and display means.

3. A logic comparator system as in claim 2 wherein each of said M error detection means includes shorting means for selectively interconnecting the selected logic circuit terminal and the reference logic circuit monitored thereby when the terminal of the selected logic circuit terminal is that which is connected to the power bus or return line for applying the same power and return signals to the reference logic circuit.

4. A logic comparator system as in claim 2 wherein: each of said error detection means comprises:

first terminal means for coupling to a terminal of the selected logic circuit;

second terminal means for coupling to a terminal of the reference logic circuit that corresponds to the terminal of the selected logic circuit to which the first terminal means is coupled; and signal comparison means having two input terminals, one being connected to the first terminal means and the other connected to the second terminal means for comprising the signals on the first and second terminal means and for generating an error signal if the logic levels of those signals are inconsistent; and each of said discrimination means comprises a first resistor connected between the first and second terminal means of the corresponding error detection means.

5. A logic comparator system as in claim 4 wherein each of said M error detectors further includes a manually operable switch connected between the first and second terminal means, said switch being closed when the first terminal means is coupled to the power or return terminal of the selected logic circuit, and otherwise open.

6. A logic comparator system as in claim 5 wherein each of said M error detectors further include line termination and clamp means connected to the first terminal means for reducing signal crosstalk and echoes, and for clamping the first terminal means to the opposite logic level of the signal on the second terminal means when the terminal of the selected logic circuit that is coupled to the first terminal means is free floating.

7. A logic comparator system as in claim 4 wherein each of said M error detectors further includes line termination and clamp means connected to the first terminal means for reducing signal crosstalk and echoes, and for clamping the first terminal means to the opposite logic level of the signal on the second terminal means when the terminal of the selected logic circuit that is coupled to the first terminal means is free floating.

8. A logic comparator system as in claim 7 wherein each of said M error detectors further includes a manually operable switch connected between the first and second terminal means, said switch being closed when the first terminal means is coupled to the power or return terminal of the selected logic circuit, and otherwise open.

9. A logic comparator system as in claim 1 wherein each of said M error detection means includes shorting means for selectively interconnecting the selected logic circuit terminal and the reference logic circuit monitored thereby when the terminal of the selected logic circuit terminal is that which is connected to the power bus or return line for applying the same power and return signals to the reference logic circuit.

10. A logic comparator system as in claim 1 wherein:
each said error detection means comprises:
first terminal means for coupling to a terminal of the selected logic circuit;
second terminal means for coupling to a terminal of the reference logic circuit that corresponds to the terminal of the selected logic circuit to which the first terminal means is coupled; and
signal comparison means having two input terminals, one being connected to the first terminal means and the other connected to the second terminal means for comparing the signals on the first and second terminal means and for generating an error signal if the logic levels of those signals are inconsistent; and
each of said discrimination means comprises a first resistor connected between the first and second terminal means of the corresponding error detection means.

11. A logic comparator system as in claim 10 wherein each of said M error detectors further includes a manually operable switch connected between the first and second terminal means, said switch being closed when the first terminal means is coupled to the power or return terminal of the selected logic circuit, and otherwise open.

12. A logic comparator system as in claim 11 wherein each of said M error detectors further includes line termination and clamp means connected to the first terminal means for reducing signal crosstalk and echoes, and for clamping the first terminal means to the opposite logic level of the signal on the second terminal means when the terminal of the selected logic circuit that is coupled to the first terminal means is free floating.

13. A logic comparator system as in claim 10 wherein each of said M error detectors further includes line termination and clamp means connected to the first terminal means for reducing signal crosstalk and echoes, and for clamping the first terminal means to the opposite logic level of the signal on the second terminal means when the terminal of the selected logic circuit that is coupled to the first terminal means is free floating.

14. A logic comparator system as in claim 13 wherein each of said M error detectors further includes a manually operable switch connected between the first and second terminal means, said switch being closed when the first terminal means is coupled to the power or return terminal of the selected logic circuit, and otherwise open.

15. A comparator circuit for testing individual corresponding terminals of a selected logic circuit against the operation of a like type and style reference logic circuit, said comparator circuit comprising:
first terminal means for coupling to a terminal of the selected logic circuit;
second terminal means for coupling to a terminal of the reference logic circuit that corresponds to the terminal of the selected logic circuit to which the first logic means is coupled;
a first resistor means connected between the first and second terminal means for automatically discriminating during operation between input and output type terminals to prevent the generation of a false error signal, and for applying the input signals on the first terminal means to the second terminal means; and
signal comparison means having two input terminal means, one being connected to the first terminal means and the other connected to the second terminal means for comparing the signals on the first and second terminal means and generating an error signal if the logic levels of those signals are inconsistent.

16. A comparator circuit as in claim 15 further includes a first manually operable switch connected between the first and second terminal means, said first switch being closed when the first terminal means is coupled to the power or return terminal of the selected logic circuit, otherwise open.

17. A comparator circuit as in claim 15 further includes line termination and clamp means connected to the first terminal means for reducing signal crosstalk and echoes, and for clamping the first terminal means to the opposite logic level of the signal on the second terminal means when the terminal of the selected logic circuit that is coupled to the first terminal means is free floating.

18. A comparator circuit as in claim 17 wherein said line termination and clamp means includes a voltage divider connected between the bus and return terminals of the selected logic circuit with the first terminal means connected to the intermediate tap.

19. A comparator circuit as in claim 15 wherein said signal comparison means includes a two input terminal exclusive OR gate of the same type as the selected logic circuit and the reference logic circuit.

20. A comparator circuit as in claim 15 further comprising:
error display means responsive to the output signal from the signal comparison means for visibly displaying an error indication;
error display driver and memory means coupled to receive the output signal from the signal comparison means for latching upon the change of state of said output signal to continuously drive the error display means; and
reset means for resetting the error memory and display means.

21. A comparator circuit as in claim 20 wherein said signal comparison means includes a two input terminal exclusive OR gate of the same type as the selected logic circuit and the reference logic circuit.

22. A comparator circuit as in claim 21 wherein:
said error display driver and memory includes an SCR having its gate coupled to the output terminal of the exclusive OR gate and its cathode connected to the return line;
said error display means includes an LED having its cathode connected to the anode of the SCR; and
said reset means includes a second switch which is normally closed to be momentarily opened to interrupt the current flow through the SCR, thus extinguishing it and the LED.

* * * * *